(12) United States Patent
Jiu (10) Patent No.: US 12,257,622 B2
(45) Date of Patent: Mar. 25, 2025

(54) JOINING MATERIAL, PRODUCTION METHOD FOR JOINING MATERIAL, AND JOINED BODY

(71) Applicant: SENJU METAL INDUSTRY CO., LTD., Tokyo (JP)

(72) Inventor: Jinting Jiu, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 17/642,901

(22) PCT Filed: Oct. 14, 2020

(86) PCT No.: PCT/JP2020/038781
§ 371 (c)(1),
(2) Date: Mar. 14, 2022

(87) PCT Pub. No.: WO2021/075463
PCT Pub. Date: Apr. 22, 2021

(65) Prior Publication Data
US 2022/0347745 A1 Nov. 3, 2022

(30) Foreign Application Priority Data

Oct. 15, 2019 (JP) .................. 2019-188913

(51) Int. Cl.
*B22F 1/052* (2022.01)
*B22F 1/00* (2022.01)
(Continued)

(52) U.S. Cl.
CPC ............. *B22F 1/052* (2022.01); *B22F 1/00* (2013.01); *B22F 1/0545* (2022.01); *B22F 1/06* (2022.01);
(Continued)

(58) Field of Classification Search
CPC .................................................. H05K 3/32
See application file for complete search history.

(56) References Cited

U.S. PATENT DOCUMENTS 3,858,096 A * 12/1974 Kuhrt .................. H01L 24/33
257/746
6,348,081 B1 2/2002 Horata et al.
(Continued)

FOREIGN PATENT DOCUMENTS

| CN | 104347564 | 2/2015 |
| CN | 105637595 | 6/2016 |

(Continued)

OTHER PUBLICATIONS

ASM Handbook, Powder Metallurgy, vol. 7, "Sintering Theory and Fundamentals", 2015, p. 1 (Year: 2015).*
(Continued)

*Primary Examiner* — Alexandra M Moore
*Assistant Examiner* — Austin Pollock
(74) *Attorney, Agent, or Firm* — NIXON PEABODY LLP; Jeffrey L. Costellia (57) ABSTRACT

In the joined body (10) in which the conductor (12) and the substrate (14) are joined by the joining material (13), the joining material (13) includes a sintered body formed by sintering silver powder. A sintered body having a porosity of 8% to 30% and a surface roughness Ra of a joining surface of 500 nm or more and 3.3 μm or less is adopted.

13 Claims, 4 Drawing Sheets

(51) Int. Cl.
  *B22F 1/0545*   (2022.01)
  *B22F 1/06*   (2022.01)
  *B22F 1/065*   (2022.01)
  *B22F 1/068*   (2022.01)
  *B22F 1/107*   (2022.01)
  *B22F 3/11*   (2006.01)
  *B22F 7/00*   (2006.01)
  *B22F 7/04*   (2006.01)
  *B23K 35/30*   (2006.01)
  *H01L 23/00*   (2006.01)

(52) U.S. Cl.
  CPC ............... *B22F 1/107* (2022.01); *B22F 3/11* (2013.01); *B22F 7/002* (2013.01); *B22F 7/008* (2013.01); *B22F 7/04* (2013.01); *B23K 35/3006* (2013.01); *H01L 24/27* (2013.01); *H01L 24/29* (2013.01); *B22F 1/065* (2022.01); *B22F 1/068* (2022.01); *B22F 2007/042* (2013.01); *B22F 2301/10* (2013.01); *B22F 2301/15* (2013.01); *B22F 2301/255* (2013.01); *B22F 2301/30* (2013.01); *H01L 2224/271* (2013.01); *H01L 2224/29139* (2013.01); *H01L 2224/29339* (2013.01)

(56) References Cited

U.S. PATENT DOCUMENTS

| | | | | |
|---|---|---|---|---|
| 2012/0160293 | A1* | 6/2012 | Jinushi | H10N 10/01 |
| | | | | 136/201 |
| 2012/0291454 | A1* | 11/2012 | Kahler | H10N 10/852 |
| | | | | 156/60 |
| 2017/0283624 | A1* | 10/2017 | Kunimune | B22F 9/30 |
| 2019/0058101 | A1* | 2/2019 | Oi | H10N 10/13 |
| 2019/0118257 | A1* | 4/2019 | Kurita | B22F 1/107 |
| 2021/0111327 | A1* | 4/2021 | Arai | H01L 35/34 |
| 2022/0143692 | A1* | 5/2022 | Nakajo | C22C 1/10 |

FOREIGN PATENT DOCUMENTS

| | | | | |
|---|---|---|---|---|
| CN | 106457384 | | 2/2017 | |
| CN | 106715039 | | 5/2017 | |
| CN | 107833651 | A | 3/2018 | |
| CN | 110114175 | | 8/2019 | |
| JP | 10-088206 | | 4/1998 | |
| JP | 10088206 | A * | 4/1998 | |
| JP | 2001-028302 | | 1/2001 | |
| JP | 2003342610 | A * | 12/2003 | |
| JP | 2006-041170 | | 2/2006 | |
| JP | 2009-215599 | | 9/2009 | |
| JP | 2010-248617 | | 11/2010 | |
| JP | 4876979 | | 2/2012 | |
| JP | 2012-052198 | | 3/2012 | |
| JP | 2014-213325 | | 11/2014 | |
| JP | 2016-169411 | | 9/2016 | |
| JP | 2016169411 | A * | 9/2016 | |
| JP | 2019016786 | A | 1/2019 | |
| WO | WO-2019/026799 | | 2/2019 | |
| WO | WO-2019065221 | A1 * | 4/2019 | H01B 1/00 |
| WO | WO-2019/092959 | | 5/2019 | |
| WO | WO-2019/163710 | | 8/2019 | |

OTHER PUBLICATIONS

PSM Industries; "What is Metal Sintering"; https://www.psmindustries.com/blog/what-is-metal-sintering, retrieved from internet on Aug. 3, 2024 (Year: 2022).*
Tian et al., "Testing Method of Density and Porosity of Dense Ceramic Materials", 8th term, vol. 47, 2011, pp. 476-479.
Taiwan Office Action for Application No. 109135723, mailed May 9, 2022 (2 pages).
International Search Report for PCT/JP2020/038781, mailed Dec. 22, 2020, (4 pages).
Notice of Reasons for Rejection for 2019-188913, mailed Jul. 7, 2020, (11 pages).
Notice of Reasons for Rejection for 2019-188913, mailed Nov. 4, 2020 (5 pages).
International Preliminary Report for PCT/JP2020/038781, mailed Aug. 3, 2021.
Chinese Office Action (App. No. 202080065124.1) mailed Oct. 10, 2022 (14 pages).
Korean Notice of Allowance (App. No. 10-2022-7009180) mailed Oct. 25, 2022 (4 pages).
Chuantong et al., "Direct bonding with Ni—P finished DBC substrate with sinter Ag micro-sized particles", 2019, International Conference on Electronics Packaging (ICEP), Japan Institute of Electronics Packaging, Apr. 17, 2019, pp. 61-64.
Extended European Search Report for Application No. 20876598.2, mailed Sep. 22, 2023, (10 pages).

* cited by examiner

JOINING MATERIAL, PRODUCTION METHOD FOR JOINING MATERIAL, AND JOINED BODY

TECHNICAL FIELD

The present invention relates to a joining material, a method for producing a joining material, and a joined body. Priority is claimed on Japanese Patent Application No. 2019-188913, filed Oct. 15, 2019, the content of which is incorporated herein by reference.

BACKGROUND OF THE INVENTION

A power semiconductor using silicon carbide (SiC) is smaller in size than a semiconductor using silicon of the related art, has a feature of reducing energy loss, and can operate even at a high temperature of 300° C. or higher.

In a case of operating a SiC power semiconductor at a high temperature, solder of the related art having a heat-resistant temperature of approximately 150° C. in an operating environment is not suitable as a joining material. As an alternative joining material, a paste (metal fine particle paste) in which metal fine particles are dispersed in a solvent and which is excellent in heat resistance and electrical conductivity is being studied.

However, in a case where a substrate and a chip are joined at a high temperature using the metal fine particle paste, there is a problem in that the solvent volatilizes at the time of joining and large pores (voids) are generated at a joined portion, or a position of the chip is shifted in the obtained joined body.

On the other hand, in order to suppress the formation of large pores in the joined portion, a method for producing a joining material by molding silver particles while pressurizing and joining base materials by using this joining material is known (see Patent Document 1).

DOCUMENTS OF RELATED ART

Patent Documents

[Patent Document 1]
 Japanese Patent No. 4876979

SUMMARY OF THE INVENTION

Problems to be Solved by the Invention

However, in a case where a substrate and a chip are joined at a high temperature using the joining material described in Patent Document 1, there is a problem in that the joining strength of the obtained joined body is not sufficient.

Therefore, an object of the present invention is to provide a joining material capable of producing a joined body having excellent joining strength compared with that of the related art, a method for producing the joining material, and a joined body using the joining material.

Means to Solve the Problems

In order to solve the aforementioned problems, the present invention has adopted the following configuration.

That is, according to a first aspect of the present invention, a joining material is provided containing a sintered body formed by sintering silver powder, in which a porosity of the sintered body is 8% to 30%, and a surface roughness Ra of a joining surface is 500 nm or more and 3.3 µm or less.

According to a second aspect of the present invention, a method for producing a joining material is provided, the method including a step of heating a coating film formed by using a dispersion liquid of a solvent and silver powder to obtain a sintered body, in which a content of the solvent in the dispersion liquid is 5% by mass or more and 25% by mass or less.

According to a third aspect of the present invention, a method for producing a joining material is provided, the method including a step of heating a coating film formed by using a dispersion liquid of a solvent and silver powder to obtain a sintered body, in which the silver powder contains a first silver particle group and a second silver particle group having different average particle diameters, an average particle diameter of the first silver particle group is 50 nm or more and less than 1000 nm, and an average particle diameter of the second silver particle group is 1 µm or more and less than 20 µm.

In the method for producing a joining material according to the third aspect, it is preferable that the silver powder further contain a third silver particle group having an average particle diameter of 20 µm or more and less than 60 µm.

In the method for producing a joining material according to the second or third aspect, it is preferable that, in the step of obtaining the sintered body, the coating film be heated while applying a pressure of 5 MPa or less to the coating film.

It is preferable that the method for producing a joining material according to the second or third aspect further include a step of polishing a surface of the sintered body, or a step of performing plating with one or more selected from the group consisting of silver, copper, tin, gold, and nickel on the surface of the sintered body.

According to a fourth aspect of the present invention, a joined body is provided including a conductor and a substrate that are joined by the joining material according to the first aspect.

Effects of the Invention

According to the present invention, it is possible to provide a joining material capable of producing a joined body having excellent joining strength compared with that of the related art, a method for producing the joining material, and a joined body using the joining material.

EMBODIMENTS FOR CARRYING OUT THE INVENTION

Figure 1:
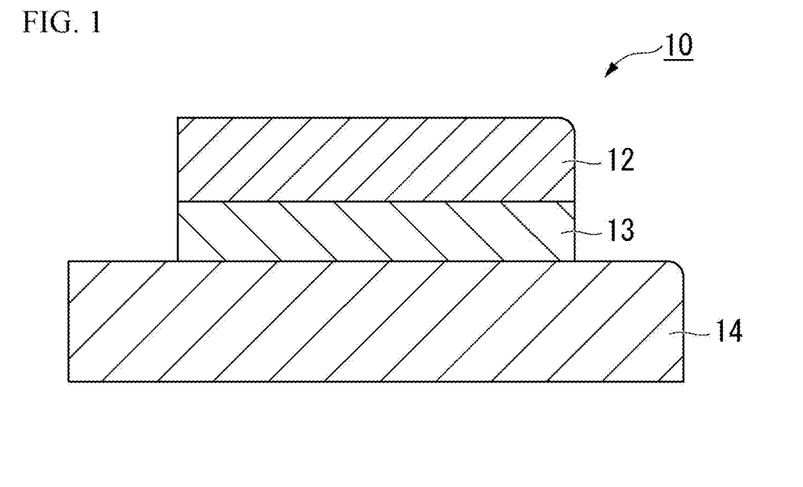
FIG. 1 is a cross-sectional view showing an embodiment of a joined body according to the present invention.

FIG. 1 is a cross-sectional view showing an embodiment of a joined body according to the present invention.

A joined body 10 shown in FIG. 1 is a laminate in which a conductor 12 and a substrate 14 are joined by a joining material 13.

The joined body 10 of the present embodiment is characterized by the joining material 13, and various well-known joined bodies can be suitably applied to other configurations.

[Joining Material]

The joining material of the present embodiment contains a sintered body formed by sintering silver powder, a porosity of the sintered body is 8% to 30%, and a surface roughness Ra of a joining surface is 500 nm or more and 3.3 μm or less.

In the present specification, the joining material contains a material for joining two objects, and typically contains a material for joining a conductor and a substrate by being interposed therebetween.

The porosity of the sintered body contained in the joining material of the present embodiment is 8% to 30%, preferably 8% to 20%, and more preferably 9% to 15%.

When the porosity of the sintered body is within the range described above, for example, it can be said that a joining strength between the conductor and the substrate (shear strength of the joined body) is excellent.

Here, the shear strength means a strength measured by a method based on JIS Z 3198-7:2003. A specific measurement method will be described later in the examples.

In the present specification, the porosity of the sintered body is measured as follows.

First, the sintered body is immersed in water to measure a volume of the sintered body, and a mass of the sintered body is measured. In addition, the volume in a case where the sintered body does not have pores corresponding to the mass thereof is calculated based on a theoretical density. The porosity of the sintered body is calculated from the measured volume and the theoretical volume in a case where there are no pores.

As a method for controlling the porosity of the sintered body contained in the joining material of the present embodiment within the range described above, for example, a method for suitably selecting the kind or the particle diameter of silver powder, a method for suitably setting a pressure condition at the time of sintering, a method for adjusting the amount of a solvent of a dispersion liquid in a case of producing the joining material by using the dispersion liquid of the silver powder, and the like are exemplary examples.

The joining material of the present embodiment may contain a substance other than the sintered body formed from the silver powder, as long as the shear strength of the joined body is sufficient.

A shape of the joining material of the present embodiment is not particularly limited, and a flat plate shape such as a disk, a rectangular plate, and the like; a rod shape such as a cylindrical shape, a columnar shape, a polygonal cylindrical shape, a polygonal columnar shape, and the like, and a spherical shape are exemplary examples.

In addition, the joining material of the present embodiment may have a thick portion having a thickness of 1 mm or less, in order to facilitate joining.

A size of the joining material is not particularly limited, and may be suitably adjusted according to specifications of the substrate and the conductor. In a case where the shape of the joining material is a disk shape, a diameter of the disk is preferably 0.5 to 50 mm and more preferably 2 to 30 mm. In a case where the shape of the joining material is a rectangular plate shape, a length of a long side is preferably 0.5 to 50 mm and more preferably 2 to 30 mm.

A surface roughness Ra of the joining surface in the joining material of the present embodiment is 500 nm or more, preferably 800 nm or more, more preferably 1.06 μm or more, and even more preferably 1.4 μm or more.

In addition, the surface roughness Ra of the joining surface in the joining material of the present embodiment is 3.3 μm or less, preferably 3.1 μm or less, more preferably 2.9 μm or less, and even more preferably 2.8 μm or less.

An upper limit value and a lower limit value of the surface roughness Ra of the joining surface in the joining material of the present embodiment may be arbitrarily combined.

The combination of the upper limit value and the lower limit value of the surface roughness Ra is 500 nm or more and 3.3 μm or less, preferably 800 nm or more and 3.3 μm or less, more preferably 1.06 μm or more and 3.3 μm or less, and even more preferably 1.4 μm or more and 2.8 μm or less.

As will be described later in the examples, in a case where the surface roughness Ra of the joining surface is within the range described above, the shear strength of the joined body can be excellent.

In the joining material of the present embodiment, the numerical ranges of the porosity of the sintered body and the surface roughness Ra of the joining surface defined above may be arbitrarily combined.

The combination of the porosity of the sintered body and the surface roughness Ra of the joining surface is a porosity of 8% to 30% and a surface roughness Ra of 500 nm or more and 3.3 μm or less, preferably a porosity of 8% to 30% and a surface roughness Ra of 1.06 μm or more and 3.3 μm or less, more preferably a porosity of 8% to 27% and a surface roughness Ra of 1.06 μm or more and 2.8 μm or less, and even more preferably a porosity of 8% to 27%, and a surface roughness Ra of 1.4 μm or more and 2.8 μm or less.

Surface roughness:

The surface roughness of the joining surface of the joining material can be measured as follows. The surface roughness is measured for five arbitrary points of the surface of the joining material by using an ultra-depth color 3D shape-measuring microscope (KEYENCE, VK-9510), and an average value is calculated.

The method for controlling the surface roughness Ra of the joining surface of the joining material within the range described above is not particularly limited, and a method for polishing the surface of the sintered body, a method for plating the surface of the sintered body, and the like are exemplary examples. The kind of plating is not particularly limited, and plating with one kind of metal selected from the group consisting of silver, copper, tin, gold, and nickel, or with an alloy consisting of two or more thereof is exemplary. For the plating, overlapping plating of two or more layers having different compositions may be used.

In the joining material of the present embodiment, in a case where the surface of the sintered body is polished, the surface roughness Ra of the joining surface of the joining material is 500 nm or more, preferably 1.06 µm or more, more preferably 1.5 µm or more, and even more preferably 1.7 µm or more.

In the joining material of the present embodiment, in a case where the surface of the sintered body is polished, the surface roughness Ra of the joining surface of the joining material is 3.3 µm or less, preferably 3.1 µm or less, more preferably 2.9 µm or less, and even more preferably 2.8 µm or less.

The upper limit value and the lower limit value of the surface roughness Ra of the joining surface in the joining material may be arbitrarily combined.

In the joining material of the present embodiment, in a case where the surface of the sintered body is polished, the combination of the upper limit value and the lower limit value of the surface roughness Ra of the joining surface of the joining material is 500 nm or more and 3.3 µm or less, preferably 1.06 µm or more and 3.3 µm or less, more preferably 1.5 µm or more and 2.9 µm or less, and even more preferably 1.7 µm or more and 2.8 µm or less.

In the joining material of the present embodiment, in a case where the surface of the sintered body is polished, the numerical ranges of the porosity of the sintered body and the surface roughness Ra of the joining surface defined above may be arbitrarily combined.

In the joining material of the present embodiment, in a case where the surface of the sintered body is polished, the combination of the porosity of the sintered body and the surface roughness Ra of the joining surface is a porosity of 8% to 30% and a surface roughness Ra of 500 nm or more and 3.3 µm or less, preferably a porosity of 8% to 30% and a surface roughness Ra of 1.06 µm or more and 3.3 µm or less, more preferably a porosity of 8% to 27% and a surface roughness Ra of 1.5 µm or more and 3.1 µm or less, and even more preferably a porosity of 8% to 27%, and a surface roughness Ra of 1.7 µm or more and 2.8 µm or less.

In the joining material of the present embodiment, in a case where the surface of the sintered body is plated, the surface roughness Ra of the joining surface of the joining material is 500 nm or more, preferably 800 nm or more, more preferably 1.06 µm or more, and even more preferably 1.4 µm or more.

In the joining material of the present embodiment, in a case where the surface of the sintered body is plated, the surface roughness Ra of the joining surface of the joining material is 3.3 µm or less, preferably 2.5 µm or less, more preferably 2.0 µm or less, and even more preferably 1.8 µm or less.

The upper limit value and the lower limit value of the surface roughness Ra of the joining surface in the joining material may be arbitrarily combined.

In the joining material of the present embodiment, in a case where the surface of the sintered body is plated, the combination of the upper limit value and the lower limit value of the surface roughness Ra of the joining surface of the joining material is 500 nm or more and 3.3 µm or less, preferably 1.06 µm or more and 3.3 µm or less, more preferably 1.06 µm or more and 2.0 µm or less, and even more preferably 1.4 µm or more and 1.8 µm or less.

In the joining material of the present embodiment, in a case where the surface of the sintered body is plated, the numerical ranges of the porosity of the sintered body and the surface roughness Ra of the joining surface defined above may be arbitrarily combined.

In the joining material of the present embodiment, in a case where the surface of the sintered body is plated, the combination of the porosity of the sintered body and the surface roughness Ra of the joining surface is a porosity of 8% to 30% and a surface roughness Ra of 500 nm or more and 3.3 µm or less, preferably a porosity of 8% to 27% and a surface roughness Ra of 1.06 µm or more and 3.3 µm or less, more preferably a porosity of 9% to 15% and a surface roughness Ra of 1.06 µm or more and 2.0 µm or less, and even more preferably a porosity of 9% to 13%, and a surface roughness Ra of 1.4 µm or more and 1.8 µm or less.

The joining material of the present embodiment described above contains a sintered body of silver powder having a porosity of the sintered body of 8% to 30%, and a surface roughness Ra of the joining surface of 500 nm or more and 3.3 µm or less. As described above, since the sintered body of silver powder having the surface roughness Ra of the joining surface in the specific range and the specific porosity is adopted, according to the joining material of the present embodiment, a joined body having excellent joining strength compared with that of the related art can be produced.

In addition, the sintered body does not melt even at a temperature higher than a melting point of the silver powder. Further, by using the joining material containing this sintered body, it is possible to perform joining at a temperature lower than the melting point of the bulk.

[Method for Producing Joining Material]

The method for producing the joining material of the present embodiment includes a step of heating a coating film formed by using a dispersion liquid of a solvent and silver powder to obtain a sintered body.

(Solvent)

The dispersion liquid of the present embodiment is obtained by dispersing the silver powder in a solvent.

As the solvent used herein, water, an alcohol-based solvent, a glycol ether-based solvent, terpineols, and the like are exemplary examples.

As alcohol-based solvents, isopropyl alcohol, 1,2-butanediol, isobornyl cyclohexanol, 2,4-diethyl-1,5-pentanediol, 2,2-dimethyl-1,3-propanediol, 2,5-dimethyl-2,5-hexanediol, 2,5-dimethyl-3-hexyne-2,5-diol, 2,3-dimethyl-2,3-butanediol, 1,1,1-tris (hydroxymethyl) ethane, 2-ethyl-2-hydroxymethyl-1,3-propanediol, 2,2'-oxybis (methylene) bis (2-ethyl-1,3-propanediol), 2,2-bis (hydroxymethyl)-1,3-propanediol, 1,2,6-trihydroxyhexane, bis [2,2,2-tris (hydroxymethyl) ethyl] ether, 1-ethynyl-1-cyclohexanol, 1,4-cyclohexanediol, 1,4-cyclohexanedimethanol, erythritol, threitol, guaiacol glycerol ether, 3,6-dimethyl-4-octyne-3,6-diol, 2,4,7,9-tetramethyl-5-decyne-4,7-diol, and the like are exemplary examples.

As the glycol ether-based solvent, diethylene glycol mono-2-ethylhexyl ether, ethylene glycol monophenyl ether, 2-methylpentane-2,4-diol, diethylene glycol monohexyl ether, diethylene glycol dibutyl ether, and triethylene glycol monobutyl ether, and the like are exemplary examples.

(Silver Powder)

As the silver powder used herein, it is preferable to use a combination of silver particle groups having different average particle diameters. By using silver particle groups having different average particle diameters in combination, a joining material having a specific porosity (8% to 30%) can be easily produced.

Average particle diameter: p For the average particle diameter of the silver particle group, a value of a median diameter D50 is adopted. In the present invention, the median diameter D50 of each silver powder means a diameter measured by a laser diffraction method (volume-average particle diameter) using SALD-2300 (manufactured by Shimadzu Corporation).

As a preferable combination of silver particle groups having different average particle diameters, a combination of a nano-order silver particle group and a micro-order silver particle group is used.

For example, it is preferable that the first silver particle group and the second silver particle group having different average particle diameters be included, the average particle diameter of the first silver particle group be 50 nm or more and less than 1000 nm, and the average particle diameter of the second silver particle group be 1 μm or more and less than 20 μm.

The average particle diameter of the first silver particle group is 50 nm or more and less than 1000 nm, preferably 100 nm or more and 800 nm or less, and more preferably 200 nm or more and 500 nm or less.

The average particle diameter of the second silver particle group is 1 μm or more and less than 20 μm, preferably 3 μm or more and 15 μm or less, and more preferably 3 μm or more and 10 μm or less.

By using the first silver particle group and the second silver particle group in combination, a joining material having a specific porosity (8% to 30%) can be easily produced, and a joined body having an increased joining strength can be easily obtained.

A shape of the silver particle of the first silver particle group is not particularly limited, and may be any of a spherical or non-spherical shape. As the non-spherical shape, a flake shape, a needle shape, a horn shape, a branch shape, a granular shape, an irregular shape, a teardrop shape, a plate shape, an ultrathin plate shape, a hexagonal plate shape, a columnar shape, a rod shape, a porous shape, a fibrous shape, a lump shape, a sponge shape, an inclined shape, a round shape, and the like are exemplary examples. Among such shapes, the spherical and columnar shapes are preferable.

The second silver particle group preferably contains flake-shaped silver particles. In this case, the second silver particle group may be such that the majority of the silver particles are recognized as the flake shape (shape of thin pieces or chips) under a microscope. Typically, it means that 51% by mass or more of the particles (primary particles) constituting the second silver particle group have a flake (thin pieces or chips) shape. Here, particles having the flake shape (shape of thin pieces or chips) mean particles having an aspect ratio (ratio of longest major axis/shortest minor axis) of 5 to 300.

The silver powder of the present embodiment may further contain a third silver particle group having an average particle diameter of 20 μm or more and less than 60 μm.

The average particle diameter of the third silver particle group is 20 μm or more and less than 60 μm, preferably 30 μm or more and 50 μm or less, and more preferably 35 μm or more and 45 μm or less.

By further using the third silver particle group in addition to the first silver particle group and the second silver particle group in combination, a joining material having a specific porosity (8% to 30%) can be produced more stably.

A shape of the silver particle of the third silver particle group is not particularly limited, and may be any of a spherical or non-spherical shape. As the non-spherical shape, a flake shape, a needle shape, a horn shape, a branch shape, a granular shape, an irregular shape, a teardrop shape, a plate shape, an ultrathin plate shape, a hexagonal plate shape, a columnar shape, a rod shape, a porous shape, a fibrous shape, a lump shape, a sponge shape, an inclined shape, a round shape, and the like are exemplary examples. Among such shapes, the spherical and columnar shapes are preferable.

In addition, as the first silver particle group, the second silver particle group, and the third silver particle group, two or more kinds having different average particle diameters may be used as each silver particle group.

In the silver powder of the present embodiment, it is preferable to use two or more kinds having different average particle diameters as the second silver particle group. For example, as the second silver particle group, it is preferable to use the silver particle group having an average particle diameter of 1 μm or more and less than 10 μm and the silver particle group having an average particle diameter of 10 μm or more and less than 20 μm in combination.

In a case where the silver particle groups having different average particle diameters are used in combination as the silver powder of the present embodiment, a percentage of the first silver particle group is preferably 1 to 50% by mass, more preferably 1 to 30% by mass, and even more preferably 3 to 10% by mass with respect to a total mass (100% by mass) of the silver powder.

A percentage of the second silver particle group is preferably 30 to 99% by mass, more preferably 45 to 90% by mass, and even more preferably 50 to 90% by mass with respect to the total mass (100% by mass) of the silver powder.

In a case of further using the third silver particle group in combination, a percentage of the third silver particle group is preferably 1 to 70% by mass, more preferably 1 to 50% by mass, and even more preferably 1 to 45% by mass with respect to a total mass (100% by mass) of the silver powder. However, a sum of the percentages of the first silver particle group, the second silver particle group, and the third silver particle group does not exceed 100% by mass.

(Dispersion Liquid)

In the dispersion liquid of the solvent and the silver powder in the present embodiment, a content of the solvent in the dispersion liquid is preferably 5% by mass or more and 25% by mass or less, more preferably 5% by mass or more and 20% by mass or less, even more preferably 5% by mass or more and 15% by mass or less, and particularly preferably 6% by mass or more and 10% by mass or less.

By setting the content of the solvent in the dispersion liquid to 5% by mass or more and 25% by mass or less, a sintered body having a porosity of 8% to 30% can be easily obtained.

When the dispersion liquid is sintered, the solvent in the dispersion liquid is volatilized and the pores are formed in the sintered body. By setting the content of the solvent in the dispersion liquid within the range described above, the porosity of the sintered body can be set to 8% to 30%.

Next, the method for producing the joining material of the present embodiment will be described in detail.

Step of obtaining sintered body:

In the step of obtaining the sintered body of the present embodiment, a coating film formed by using a dispersion liquid of a solvent and silver powder is heated to obtain a sintered body.

First, the dispersion liquid described above is applied onto a base to form a coating film. The method for coating is not particularly limited, and dispensing coating, print coating, spray coating, brush coating, injection, and the like are exemplary examples.

As a material of the base, glass, quartz, silicon, metal, and the like are exemplary examples, but there is no limitation thereto. As will be described later in the examples, for example, brass can be used as the metal, but the metal is not limited thereto.

When using a metal base, if a lubricating mold release agent is applied to the base in advance, the sintered body can be easily peeled off from the base.

Next, the coating film is heated to obtain the sintered body. A heating temperature can be suitably set, as long as it is a temperature at which the sintered body can be obtained, and is, for example, preferably 150° C. or higher and 300° C. or lower and more preferably 200° C. or higher and 250° C. or lower.

The time for heating the coating film can be suitably set, as long as it is the time during which the sintered body can be obtained, and is, for example, preferably 15 minutes or longer and 180 minutes or shorter and more preferably 30 minutes or longer and 90 minutes or shorter.

In the step of obtaining the sintered body in the present embodiment, a pressure applied to the coating film can be preferably suppressed to 5 MPa or less, can be suppressed to 1 MPa or less, and particularly can also be no pressurization.

Next, the obtained sintered body may be cut according to the specifications of the substrate and the conductor. A tool used for cutting the sintered body is not particularly limited, and scissors, a diamond knife, a paper cutter, and the like are exemplary examples. In the present specification, the cut sintered body described above may be simply referred to as the sintered body.

More specifically, the following embodiments are preferably used as the method for producing the joining material described above.

Embodiment (i): A method for producing a joining material, the method including a step of heating a coating film formed by using a dispersion liquid of a solvent and silver powder to obtain a sintered body, in which a content of the solvent in the dispersion liquid is 5% by mass or more and 25% by mass or less.

According to the embodiment (i), by setting the content of the solvent in the dispersion liquid to a specific ratio, a joining material containing a sintered body having a porosity of 8% to 30% can be easily produced.

Embodiment (ii): A method for producing a joining material, the method including a step of heating a coating film formed by using a dispersion liquid of a solvent and silver powder to obtain a sintered body, in which a content of the solvent in the dispersion liquid is 5% by mass or more and 25% by mass or less, the silver powder consists of a first silver particle group and a second silver particle group having different average particle diameters, an average particle diameter of the first silver particle group is 50 nm or more and less than 1000 nm, and an average particle diameter of the second silver particle group is 1 μm or more and less than 20 μm.

In the silver powder, for example, a percentage of the first silver particle group may be 1 to 50% by mass, and a percentage of the second silver particle group may be 50 to 99% by mass.

In the silver powder, for example, the percentage of the first silver particle group may be 5 to 30% by mass, and the percentage of the second silver particle group may be 70 to 95% by mass.

In the silver powder, for example, the percentage of the first silver particle group may be 5 to 15% by mass, and the percentage of the second silver particle group may be 85 to 95% by mass.

The percentage of the first silver particle group and the second silver particle group is the percentage with respect to the total mass (100% by mass) of the silver powder. In addition, a sum of the percentages of the first silver particle group and the second silver particle group does not exceed 100% by mass.

According to the embodiment (ii), by using the silver particle groups having specific average particle diameters in combination, a joining material containing a sintered body having a porosity of 8% to 30% can be easily produced.

Embodiment (iii): A method for producing a joining material, the method including a step of heating a coating film formed by using a dispersion liquid of a solvent and silver powder to obtain a sintered body, in which a content of the solvent in the dispersion liquid is 5% by mass or more and 25% by mass or less, the silver powder consists of a first silver particle group, a second silver particle group, a third silver particle group having different average particle diameters, an average particle diameter of the first silver particle group is 50 nm or more and less than 1000 nm, an average particle diameter of the second silver particle group is 1 μm or more and less than 20 μm, and an average particle diameter of the third silver particle group is 20 μm or more and less than 60 μm.

In the silver powder, for example, a percentage of the first silver particle group may be 1 to 50% by mass, a percentage of the second silver particle group may be 30 to 98% by mass, and a percentage of the third silver particle group may be 1 to 69% by mass.

In the silver powder, for example, the percentage of the first silver particle group may be 1 to 30% by mass, the percentage of the second silver particle group may be 30 to 90% by mass, and the percentage of the third silver particle group may be 5 to 60% by mass.

In the silver powder, for example, the percentage of the first silver particle group may be 3 to 8% by mass, the percentage of the second silver particle group may be 45 to 72% by mass, and the percentage of the third silver particle group may be 20 to 50% by mass.

The percentage of the first silver particle group, the second silver particle group, and the third silver particle group is the percentage with respect to the total mass (100% by mass) of the silver powder. However, a sum of the percentages of the first silver particle group, the second silver particle group, and the third silver particle group does not exceed 100% by mass.

According to the embodiment (iii), by using the silver particle groups having specific average particle diameters in combination, a joining material containing a sintered body having a porosity of 8% to 30% can be easily produced.

The method for producing a joining material of the present embodiment may include other steps in addition to the step of obtaining a sintered body.

For example, in order to control the roughness of the surface of the obtained sintered body, the method may further include a step of polishing a surface of the sintered body, or a step of performing plating with one or more selected from the group consisting of silver, copper, tin, gold, and nickel on the surface of the sintered body, on the subsequent stage side of the step of obtaining the sintered body.

In a case where the method for producing the joining material of the present embodiment includes the step of polishing the surface of the sintered body or the step of performing the plating, the surface roughness Ra of the joining surface in the joining material obtained by the step of polishing or the step of performing the plating is 500 nm or more, preferably 800 nm or more, more preferably 1.06 µm or more, and even more preferably 1.4 µm or more.

On the other hand, the upper limit of the surface roughness Ra of the joining surface of the joining material obtained by the step of polishing or the step of performing the plating is 3.3 µm or less, preferably 3.1 µm or less, more preferably 2.9 µm or less, and even more preferably 2.8 µm or less.

The upper limit value and the lower limit value of the surface roughness Ra of the joining surface in the joining material obtained by the step of polishing or the step of performing the plating may be arbitrarily combined.

The combination of the upper limit value and the lower limit value of the surface roughness Ra of the joining surface of the joining material obtained by the step of polishing or the step of performing the plating is 500 nm or more and 3.3 µm or less, preferably 800 nm or more and 3.3 µm or less, more preferably 1.06 µm or more and 3.3 µm or less, and even more preferably 1.4 µm or more and 2.8 µm or less.

Step of polishing surface of sintered body:

The method for polishing the surface of the sintered body is not particularly limited, and chemical polishing, electrolytic polishing, mechanical polishing, and the like are exemplary examples. As will be described later in the examples, by polishing the surface of the sintered body with abrasive paper No. 2000, a joining material capable of producing a joined body having sufficient joining strength can be obtained.

In a case where the method for producing the joining material of the present embodiment includes the step of polishing the surface of the sintered body, the surface roughness Ra of the joining surface in the joining material obtained by the step of polishing is 500 nm or more, preferably 1.06 µm or more, more preferably 1.5 µm or more, and even more preferably 1.7 µm or more.

On the other hand, the surface roughness Ra of the joining surface of the joining material obtained by the step of polishing is 3.3 µm or less, preferably 3.1 µtm or less, more preferably 2.9 µm or less, and even more preferably 2.8 µm or less.

The upper limit value and the lower limit value of the surface roughness Ra of the joining surface in the joining material obtained by the step of polishing may be arbitrarily combined.

The combination of the upper limit value and the lower limit value of the surface roughness Ra of the joining surface of the joining material obtained by the step of polishing is 500 nm or more and 3.3 µm or less, preferably 1.06 µm or more and 3.3 µm or less, more preferably 1.5 µm or more and 2.9 µm or less, and even more preferably 1.7 µm or more and 2.8 µm or less.

Step of plating surface of the sintered body:

The method for plating the surface of the sintered body is not particularly limited, and electroplating, electroless plating, vacuum plating, and the like are exemplary examples. The kind of plating is not particularly limited, and plating with one kind of metal selected from the group consisting of silver, copper, tin, gold, and nickel, or with an alloy consisting of two or more thereof is exemplary. The step of performing the plating may be plating by overlapping two or more layers of plating having different compositions.

For example, in a case where one of the objects to be joined is a copper substrate, the surface of the sintered body may be copper-plated. Accordingly, the affinity between the joining material and the copper substrate is strengthened, and the joining strength is likely to be increased.

In a case where the method for producing the joining material of the present embodiment includes the step of performing the plating of the surface of the sintered body, the surface roughness Ra of the joining surface in the joining material obtained by the step of performing the plating is 500 nm or more, preferably 800 nm or more, more preferably 1.06 µm or more, and even more preferably 1.4 µm or more.

On the other hand, the surface roughness Ra of the joining surface of the joining material obtained by the step of performing the plating is 3.3 µm or less, preferably 2.5 µm or less, more preferably 2.0 µm or less, and even more preferably 1.8 µm or less.

The upper limit value and the lower limit value of the surface roughness Ra of the joining surface in the joining material obtained by the step of performing the plating may be arbitrarily combined.

The surface roughness of the joining surface of the joining material obtained by the step of performing the plating is 500 nm or more and 3.3 µm or less, preferably 1.06 µm or more and 3.3 µm or less, more preferably 1.06 µm or more and 2.0 µm or less, and even more preferably 1.4 µm or more and 1.8 µm or less.

In a case where the method for producing the joining material includes the step of polishing the surface of the sintered body or the step of performing the plating at the subsequent stage side of the embodiment (i) of the step of obtaining the sintered body, in the joining material to be obtained, the surface roughness Ra of the joining surface is in the specific range and the sintered body has the specific porosity.

In a case where the method for producing the joining material includes the step of polishing the surface of the sintered body or the step of performing the plating at the subsequent stage side of the embodiment (ii) of the step of obtaining the sintered body, in the joining material to be obtained, the surface roughness Ra of the joining surface is in the specific range, and for the sintered body, the sintered body of the silver powder having the specific porosity is obtained.

In a case where the method for producing the joining material includes the step of polishing the surface of the sintered body or the step of performing the plating at the subsequent stage side of the embodiment (iii) of the step of obtaining the sintered body, in the joining material to be obtained, the surface roughness Ra of the joining surface is in the specific range, and for the sintered body, the sintered body of the silver powder having the specific porosity is obtained.

[Joined Body]

In the joined body of the present embodiment, as shown in FIG. 1, the conductor and the substrate are joined by the joining material described above.

As the conductor, a chip part such as a condenser and a resistor, or a Si chip, a SiC chip, GaN, and the like obtained by forming a semiconductor element such as a resistor, a transistor, a condenser, and an integrated circuit on a wafer and cutting out a section of each semiconductor element from the wafer, and the like are exemplary examples.

As the substrate, a circuit board, a glass fiber-reinforced epoxy-based printed circuit board, a polyimide-based substrate, a ceramics substrate, a metal substrate, a Cu lead frame, and the like are exemplary examples.

A temperature at the time of joining is, for example, preferably 150° C. or higher and 400° C. or lower and more preferably 200° C. or higher and 300° C. or lower.

As the method for joining the conductor and the substrate by using the joining material described above, a well-known method can be adopted.

A pressure at the time of joining is not particularly limited, and may be, for example, 0.1 MPa or more and 3 MPa or less.

The atmosphere at the time of joining may be the atmosphere or nitrogen.

In the joined body of the present embodiment described above, the joining material containing the sintered body of the silver powder having a porosity of 8% to 30% and having the surface roughness Ra of the joining surface of 500 nm or more and 3.3 μm or less is applied. Therefore, such a joined body has excellent joining strength compared with that of the related art.

EXAMPLES

Hereinafter, the present invention will be described with reference to Examples, but the present invention is not limited to the following Examples.

<Raw Materials Used>

Silver particle groups shown below were used as the silver powder.

Silver particle group 1A: Average particle diameter of 300 nm

Silver particle group 2A: Average particle diameter of 4 μm

Silver particle group 2B: Average particle diameter of 10 μm

Silver particle group 3: Average particle diameter of 42 μm

Silver particle group 1B: Average particle diameter of 50 nm

The shape of the silver particles of the silver particle groups 1A, 1B, 2A, and 3 was a spherical shape, and the shape of the silver particles of the silver particle group 2B was a flake shape.

Ethylene glycol was used as the solvent.

For the average particle diameter described above, the value of the median diameter D50 was adopted. In the present invention, the median diameter D50 of each silver powder means a diameter measured by a laser diffraction method (volume-average diameter) using SALD-2300 (manufactured by Shimadzu Corporation).

<Preparation of Dispersion Liquid of Silver Powder>

The silver particle group and the solvent described above were mixed in the composition shown in Table 1 to prepare dispersion liquids 1 to 9. In Table 1, each value of the silver particle groups indicates the percentage (mass %) of the mass of each silver particle group with respect to the total mass of the silver powder. In addition, the percentage of the solvent indicates the percentage (mass %) of the mass of the solvent with respect to the total mass of the silver powder and the solvent.

TABLE 1

| | Composition of dispersion liquid | | Composition of silver powder | | | | |
|---|---|---|---|---|---|---|---|
| | Solvent | Silver powder | Silver particle group 1A | Silver particle group 1B | Silver particle group 2A | Silver particle group 2B | Silver particle group 3 |
| Dispersion liquid 1 | 6 | 94 | 10 | 0 | 40 | 50 | 0 |
| Dispersion liquid 2 | 6 | 94 | 5 | 0 | 20 | 25 | 50 |
| Dispersion liquid 3 | 6 | 94 | 8 | 0 | 32 | 40 | 20 |
| Dispersion liquid 4 | 6 | 94 | 3 | 0 | 12 | 40 | 45 |
| Dispersion liquid 5 | 13.1 | 86.9 | 5 | 0 | 20 | 25 | 50 |
| Dispersion liquid 6 | 17.9 | 82.1 | 5 | 0 | 20 | 25 | 50 |
| Dispersion liquid 7 | 6 | 94 | 0 | 100 | 0 | 0 | 0 |
| Dispersion liquid 8 | 26 | 74 | 10 | 0 | 40 | 50 | 0 |
| Dispersion liquid 9 | 26 | 74 | 5 | 0 | 20 | 25 | 50 |

<Production of Joining Material>

Example 1

A coating film was produced on a brass base using the dispersion liquid 1.

As the brass, brass consisting of 65% by mass of copper and 35% by mass of zinc was used.

Step of obtaining sintered body:

The produced coating film was heated at 200° C. for 30 minutes without pressure to obtain a sintered body. The obtained sintered body was cut into small pieces (dimension of length×width: 3 mm×3 mm) by using scissors.

Step of polishing:

The surface of the sintered body of the obtained small piece was polished by using abrasive paper No. 2000 (water-resistant abrasive paper sheet manufactured by Sankyo Rikagaku Co., Ltd.) to obtain a joining material.

Example 2

A joining material was obtained in the same manner as in Example 1, except that the sintering conditions were changed to 250° C. for 30 minutes.

Example 3

A coating film was produced on the brass base described above using the dispersion liquid 1.

Step of obtaining sintered body:

The produced coating film was heated at 200° C. for 30 minutes without pressure to obtain a sintered body.

Step of performing silver plating:

The obtained sintered body was immersed in a solution obtained by dissolving silver acetoacetic acid in 2-ethylhexylamine and allowed to stand at 40° C. for 10 minutes. Then, the sintered body was taken out from the mixed solution and dried.

Example 4

A joining material was obtained in the same manner as in Example 3, except that the sintering conditions were changed to 250° C. for 30 minutes.

Example 5

A joining material was obtained in the same manner as in Example 1, except that the dispersion liquid used was changed to the dispersion liquid 2.

Example 6

A joining material was obtained in the same manner as in Example 5, except that the sintering conditions were changed to 250° C. for 30 minutes.

Example 7

A joining material was obtained in the same manner as in Example 3, except that the dispersion liquid used was changed to the dispersion liquid 2.

Example 8

A joining material was obtained in the same manner as in Example 7, except that the sintering conditions were changed to 250° C. for 30 minutes.

Example 9

A joining material was obtained in the same manner as in Example 2, except that the dispersion liquid used was changed to the dispersion liquid 3.

Example 10

A joining material was obtained in the same manner as in Example 2, except that the dispersion liquid used was changed to the dispersion liquid 4.

Example 11

A joining material was obtained in the same manner as in Example 5, except that the sintering conditions were changed to 250° C. for 90 minutes.

Example 12

A joining material was obtained in the same manner as in Example 2, except that the dispersion liquid used was changed to the dispersion liquid 5.

Example 13

A joining material was obtained in the same manner as in Example 2, except that the dispersion liquid used was changed to the dispersion liquid 6.

Example 14

A coating film was produced on the brass base described above using the dispersion liquid 2.

Step of obtaining sintered body:

The produced coating film was heated at 250° C. for 30 minutes without pressure to obtain a sintered body.

Step of performing copper plating:

The obtained sintered body was immersed in a solution obtained by dissolving copper (II) formate tetrahydrate (manufactured by Wako Pure Chemical Industries, Ltd., model number: LKJ3210, primary average particle diameter: 20 µm) in 2-ethylhexylamine in a nitrogen atmosphere, and allowed to stand at 140° C. for 10 minutes. Then, the sintered body was taken out from the mixed solution and dried.

Comparative Example 1

A joining material was obtained in the same manner as in Example 1, except that the dispersion liquid used was changed to the dispersion liquid 7.

Comparative Example 2

A joining material was obtained in the same manner as in Comparative Example 1, except that the sintering conditions were changed to 250° C. for 30 minutes and the sintering was performed while pressurizing at 0.4 MPa at the time of sintering.

Comparative Example 3

A joining material was obtained in the same manner as in Comparative Example 1, except that the sintering was performed while pressurizing at 0.4 MPa at the time of sintering.

Comparative Example 4

A joining material was obtained in the same manner as in Comparative Example 1, except that the sintering conditions were changed to 250° C. for 30 minutes.

Comparative Example 5

A joining material was obtained in the same manner as in Example 1, except that the dispersion liquid used was changed to the dispersion liquid 7 and the surface of the sintered body was not polished.

Comparative Example 6

A joining material was obtained in the same manner as in Comparative Example 5, except that the sintering conditions were changed to 250° C. for 30 minutes.

Comparative Example 7

A joining material was obtained in the same manner as in Example 2, except that the dispersion liquid used was changed to the dispersion liquid 8 and the surface of the sintered body was not polished.

Comparative Example 8

A joining material was obtained in the same manner as in Example 2, except that the dispersion liquid used was changed to the dispersion liquid 8.

Comparative Example 9

A joining material was obtained in the same manner as in Example 2, except that the dispersion liquid used was changed to the dispersion liquid 9 and the surface of the sintered body was not polished.

Comparative Example 10

A joining material was obtained in the same manner as in Example 2, except that the dispersion liquid used was changed to the dispersion liquid 9.

For each of the joining materials obtained in Examples 1 to 14 and Comparative Examples 1 to 10, the porosity and the surface roughness were measured by the measurement method shown below.

[Measurement of Porosity]

The volume of the joining material was measured by immersing the joining material in water, and the mass of the joining material was measured. In addition, the volume in a case where the joining material did not have pores corresponding to the mass thereof was calculated based on a theoretical density. The porosity was calculated from the measured volume and the theoretical volume in a case where there were no pores.

[Measurement of Surface Roughness]

The surface roughness was measured for five arbitrary points of the surface of the joining material by using an ultra-depth color 3D shape-measuring microscope (KEYENCE, VK-9510), and an average value was calculated. A size of the measurement point was 1400 μm×1050 μm.

Table 2 shows the sintering conditions, the porosity, and the surface roughness of each joining material obtained in Examples 1 to 14 and Comparative Examples 1 to 10.

TABLE 2

| Joining material | Dispersion liquid | Temperature and time at time of sintering | Pressure at time of sintering | Polishing, plating | Porosity (%) | Surface roughness (μm) |
|---|---|---|---|---|---|---|
| Example 1 | Dispersion liquid 1 | 200° C., for 30 minutes | No pressure | Polishing | 10.9 | 2.64 |
| Example 2 | Dispersion liquid 1 | 250° C., for 30 minutes | No pressure | Polishing | 10.6 | 2.79 |
| Example 3 | Dispersion liquid 1 | 200° C., for 30 minutes | No pressure | Silver plating | 10.3 | 1.76 |
| Example 4 | Dispersion liquid 1 | 250° C., for 30 minutes | No pressure | Silver plating | 9.7 | 1.62 |
| Example 5 | Dispersion liquid 2 | 200° C., for 30 minutes | No pressure | Polishing | 13.9 | 2.45 |
| Example 6 | Dispersion liquid 2 | 250° C., for 30 minutes | No pressure | Polishing | 13.1 | 2.36 |
| Example 7 | Dispersion liquid 2 | 200° C., for 30 minutes | No pressure | Silver plating | 12.4 | 1.49 |
| Example 8 | Dispersion liquid 2 | 250° C., for 30 minutes | No pressure | Silver plating | 11.3 | 1.53 |
| Example 9 | Dispersion liquid 3 | 250° C., for 30 minutes | No pressure | Polishing | 10.1 | 1.78 |
| Example 10 | Dispersion liquid 4 | 250° C., for 30 minutes | No pressure | Polishing | 10.8 | 2.12 |
| Example 11 | Dispersion liquid 2 | 250° C., for 90 minutes | No pressure | Polishing | 8.6 | 2.49 |
| Example 12 | Dispersion liquid 5 | 250° C., for 30 minutes | No pressure | Polishing | 17.2 | 2.76 |
| Example 13 | Dispersion liquid 6 | 250° C., for 30 minutes | No pressure | Polishing | 26.3 | 2.61 |
| Example 14 | Dispersion liquid 2 | 250° C., for 30 minutes | No pressure | Copper plating | 11.6 | 1.06 |

TABLE 2-continued

| Joining material | Dispersion liquid | Temperature and time at time of sintering | Pressure at time of sintering | Polishing, plating | Porosity (%) | Surface roughness (μm) |
|---|---|---|---|---|---|---|
| Comparative Example 1 | Dispersion liquid 7 | 200° C., for 30 minutes | No pressure | Polishing | 5.3 | 1.06 |
| Comparative Example 2 | Dispersion liquid 7 | 250° C., for 30 minutes | Pressure | Polishing | 5.1 | 1.02 |
| Comparative Example 3 | Dispersion liquid 7 | 200° C., for 30 minutes | Pressure | Polishing | 6.2 | 1.04 |
| Comparative Example 4 | Dispersion liquid 7 | 250° C., for 30 minutes | No pressure | Polishing | 6.4 | 1.02 |
| Comparative Example 5 | Dispersion liquid 7 | 200° C., for 30 minutes | No pressure | None | 6.3 | 3.54 |
| Comparative Example 6 | Dispersion liquid 7 | 250° C., for 30 minutes | No pressure | None | 6.4 | 3.37 |
| Comparative Example 7 | Dispersion liquid 8 | 250° C., for 30 minutes | No pressure | None | 36.3 | 5.76 |
| Comparative Example 8 | Dispersion liquid 8 | 250° C., for 30 minutes | No pressure | Polishing | 36.3 | 2.75 |
| Comparative Example 9 | Dispersion liquid 9 | 250° C., for 30 minutes | No pressure | None | 35.7 | 6.04 |
| Comparative Example 10 | Dispersion liquid 9 | 250° C., for 30 minutes | No pressure | Polishing | 35.7 | 2.68 |

In a case where the silver powder contains silver particle group 1 and silver particle group 2 and the content of the solvent in the dispersion liquid is 5% by mass or more and 25% by mass or less, the porosity of the sintered body of the obtained joined body of Examples 1 to 14 was 8% to 30%.

After embedding the obtained sintered body with a resin, a sintered body embedded with the resin was cut using an ion milling device IM4000PLUS (manufactured by Hitachi High-Technologies Corporation) to obtain a smoothed section. The obtained section was observed using a scanning electron microscope (SEM). A microscopic image of a cross section of the joining material obtained by an SEM is shown in FIG. 2.

Figure 2A:
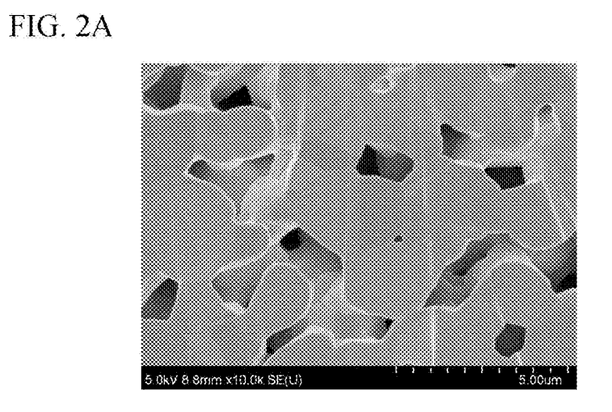
FIG. 2A is a microscopic image of a cross section of a joining material obtained by a scanning electron microscope.
Figure 2B:
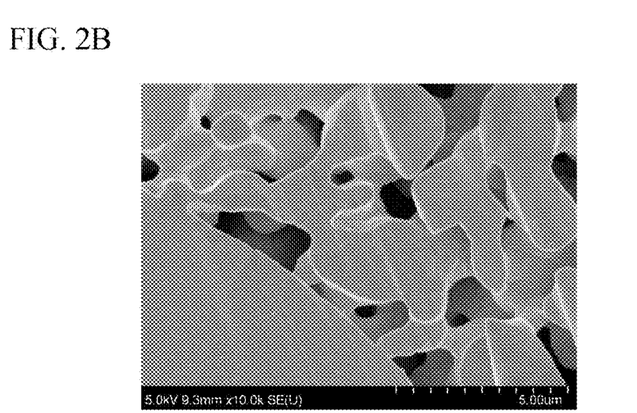
FIG. 2B is a microscopic image of a cross section of a joining material obtained by a scanning electron microscope.
Figure 2C:
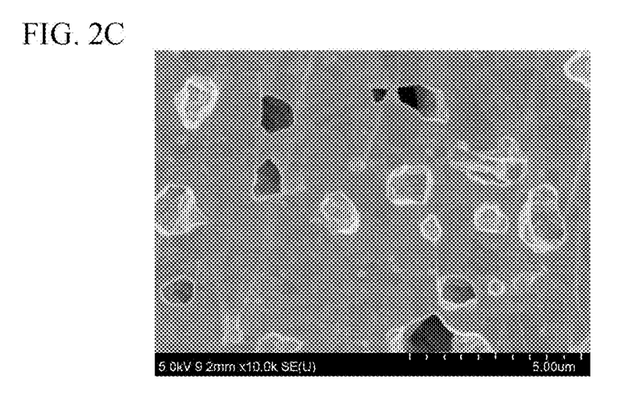
FIG. 2C is a microscopic image of a cross section of a joining material obtained by a scanning electron microscope.
Figure 2D:
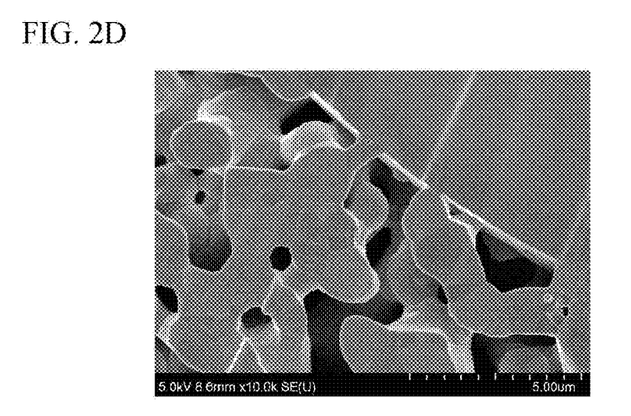
FIG. 2D is a microscopic image of a cross section of a joining material obtained by a scanning electron microscope.
Figure 2E:
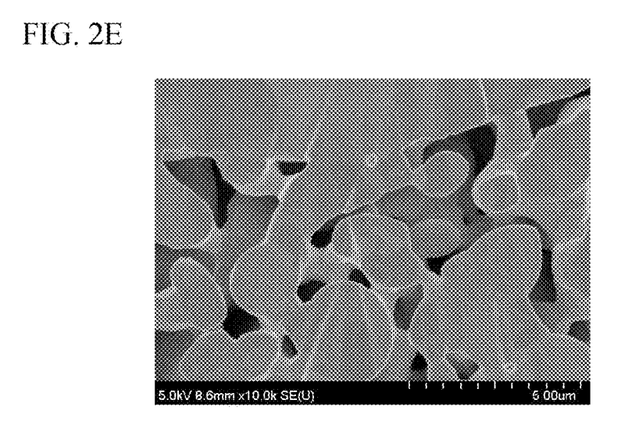
FIG. 2E is a microscopic image of a cross section of a joining material obtained by a scanning electron microscope.

FIG. 2A is a microscopic image of a cross section of the joining material of Example 2 obtained by the SEM. FIG. 2B is a microscopic image of a cross section of the joining material of Example 6 obtained by the SEM. FIG. 2C is a microscopic image of a cross section of the joining material of Comparative Example 4 obtained by the SEM. FIG. 2D is a microscopic image of a cross section of the joining material of Example 9 obtained by the SEM. FIG. 2E is a microscopic image of a cross section of the joining material of Example 10 obtained by the SEM.

As a result, on the cross sections of the joining materials of Examples 2, 6, 9, and 10, a larger number of pores were observed, compared to the cross section of the joining material of Comparative Example 4.

<Production of Joined Body>

Examples 21 to 34 and Comparative Examples 11 to 20

As the conductor, a Si chip (dimensions of length×width: 3 mm×3 mm) in which a Ti layer (thickness 40 nm) and an Ag layer (thickness 1000 nm) were laminated by sputtering was used in order from the Si chip side. As the joining material, each of the joining materials of Examples 1 to 14 and Comparative Examples 1 to 10 was used. The thickness of each joining material was 100 μm. A copper substrate was used as the substrate.

After stacking the substrate, the joining material, and the conductor in this order so that the polished surface of the joining material is the joining surface, joining was performed by setting the pressure to 0.4 MPa in the atmosphere and performing heat treatment at a temperature of 250° C. to obtain the joined body. Using the joining materials of Examples 1 to 14 and Comparative Examples 1 to 10, joined bodies of Examples 21 to 34 and Comparative Examples 11 to 20 were obtained.

The shear strengths of the obtained joined bodies of Examples 21 to 34 and Comparative Examples 11 to 20 were measured by the following measurement method. The results are shown in Table 3.

[Shear Strength Test]

The shear strength of each of the joined bodies of Examples 21 to 34 and Comparative Examples 11 to 20 was measured as follows. The measurement results are shown in Table 3.

Shear strength test:

For each of the obtained joined bodies, the shear strength (MPa) between the Si chip and the substrate was measured by the method based on JIS Z 3198-7:2003 under a condition of room temperature (25° C.) by using a universal bond tester Nordson DAGE Series 4000 (manufactured by Nordson Corporation). Each sample was measured 5 times and an average value of shear strengths (MPa) was calculated.

TABLE 3

| Joined body | Shear strength |
|---|---|
| Example 21 | 21.2 |
| Example 22 | 22.3 |
| Example 23 | 21.6 |
| Example 24 | 22.5 |
| Example 25 | 22.0 |
| Example 26 | 22.1 |
| Example 27 | 23.1 |
| Example 28 | 22.9 |
| Example 29 | 24.3 |
| Example 30 | 23.3 |
| Example 31 | 25.8 |
| Example 32 | 22.2 |
| Example 33 | 21.7 |
| Example 34 | 18.5 |
| Comparative Example 11 | 12.5 |
| Comparative Example 12 | 15.3 |

TABLE 3-continued

| Joined body | Shear strength |
| --- | --- |
| Comparative Example 13 | 13.2 |
| Comparative Example 14 | 14.9 |
| Comparative Example 15 | 0 |
| Comparative Example 16 | 0 |
| Comparative Example 17 | 0 |
| Comparative Example 18 | 10.6 |
| Comparative Example 19 | 0 |
| Comparative Example 20 | 8.6 |

In a case where the joining materials of Examples 1 to 14 having a porosity of 8% to 30% were used, the shear strengths of the joined bodies of Examples 21 to 34 were sufficient.

In a case where the joining materials of Examples 1 to 14 having a surface roughness Ra of the joining surface of 500 nm or more and 3.3 μm or less were used, the shear strengths of the obtained joined bodies of Examples 21 to 34 were sufficient.

In a case where the joining materials of Examples 1, 2, 5, 6, and 9 to 13 obtained by polishing the surface of the sintered body were used, the shear strengths of the obtained joined bodies of Examples 21, 22, 25, 26, and 29 to 33 were sufficient.

In a case where the joining materials of Examples 3, 4, 7, 8, and 14 obtained by plating the surface of the sintered body were used, the shear strengths of the obtained joined bodies of Examples 23, 24, 27, 28, and 34 were sufficient.

In a case where the content of the solvent in the dispersion liquid was increased within the range of 5% by mass or more and 25% by mass or less and the obtained joining materials of Examples 12 and 13 were used to obtain joined bodies, the shear strengths of the joined bodies of Examples 32 and 33 were sufficient.

The joining materials of Comparative Examples 1 to 6 obtained by using the dispersion liquid containing only the silver particle group 1B had a porosity of the sintered body less than 8%, and shear strengths of the joined bodies of Comparative Examples 11 to 16 using these were not sufficient.

The joining materials of Comparative Examples 7 to 10, in which the dispersion liquid having the content of the solvent of 26% was used, had a porosity of the sintered body greater than 30%, and shear strengths of the joined bodies of Comparative Examples 17 to 20 using these joining materials were not sufficient.

In a case where the joining materials of Comparative Examples 5, 6, 7, and 9 in which the surface of the sintered body was not polished and not plated were used, the shear strengths of the obtained joined bodies of Comparative Examples 25, 26, 27, and 29 were not sufficient.

In addition, as described below, by comparing the joining materials of the examples and the joining materials of the comparative examples under the condition (a) and the condition (b), the following shown below became clear.

<<Condition (a): Comparison Between Joining Materials Having the Same Composition of Silver Powder in Dispersion Liquid and Sintering Conditions>>

(1) Comparison between joining material of Example 2 and joining material of Comparative Example 8

(2) Comparison between joining material of Example 6 and joining material of Comparative Example 10

(3) Comparison between joining material of Example 12 and joining material of Comparative Example 10

(4) Comparison between joining material of Example 13 and joining material of Comparative Example 10

Comparison between joining material of Example 2 and joining material of Comparative Example 8:

When producing the joining material, the dispersion liquid 1 was used in Example 2 and the dispersion liquid 8 was used in Comparative Example 8, and the composition of the silver powder in the dispersion liquid was silver particle group 1A/silver particle group 2A/silver particle group 2B=10/40/50 (% by mass) for both joining materials.

As for the sintering conditions, the temperature and time at the time of sintering were set to 250° C. for 30 minutes, the pressure at the time of sintering was set to no pressure, and the surface of the sintered body was polished for both joining materials.

The surface roughness (μm)/porosity (%)/shear strength (MPa) of the joined body in the joining material was as follows.

In Example 2, 2.79 μm/10.6%/22.3 MPa (Example 22)

In Comparative Example 8, 2.75 μm/36.3%/10.6 MPa (Comparative Example 18)

Comparison between joining material of Example 6 and joining material of Comparative Example 10:

When producing the joining material, the dispersion liquid 2 was used in Example 6 and the dispersion liquid 9 was used in Comparative Example 10, and the composition of the silver powder in the dispersion liquid was silver particle group 1A/silver particle group 2A/silver particle group 2B/silver particle group 3=5/20/25/50 (% by mass) for both joining materials.

As for the sintering conditions, the temperature and time at the time of sintering were set to 250° C. for 30 minutes, the pressure at the time of sintering was set to no pressure, and the surface of the sintered body was polished for both joining materials.

The surface roughness (μm)/porosity (%)/shear strength (MPa) of the joined body in the joining material was as follows.

In Example 6, 2.36 μm/13.1%/22.1 MPa (Example 26)

In Comparative Example 10, 2.68 μm/35.7%/8.6 MPa (Comparative Example 20)

Comparison between joining material of Example 12 and joining material of Comparative Example 10:

When producing the joining material, the dispersion liquid 5 was used in Example 12 and the dispersion liquid 9 was used in Comparative Example 10, and the composition of the silver powder in the dispersion liquid was silver particle group 1A/silver particle group 2A/silver particle group 2B/silver particle group 3=5/20/25/50 (% by mass) for both joining materials.

As for the sintering conditions, the temperature and time at the time of sintering were set to 250° C. for 30 minutes, the pressure at the time of sintering was set to no pressure, and the surface of the sintered body was polished for both joining materials.

The surface roughness (μm)/porosity (%)/shear strength (MPa) of the joined body in the joining material was as follows.

In Example 12, 2.76 μm/17.2%/22.2 MPa (Example 32)
In Comparative Example 10, 2.68 μm/35.7%/8.6 MPa (Comparative Example 20)

Comparison between joining material of Example 13 and joining material of Comparative Example 10:

When producing the joining material, the dispersion liquid 6 was used in Example 13 and the dispersion liquid 9 was used in Comparative Example 10, and the composition of the silver powder in the dispersion liquid was silver particle group 1A/silver particle group 2A/silver particle group 2B/silver particle group 3=5/20/25/50 (% by mass) for both joining materials.

As for the sintering conditions, the temperature and time at the time of sintering were set to 250° C. for 30 minutes, the pressure at the time of sintering was set to no pressure, and the surface of the sintered body was polished for both joining materials.

The surface roughness (μm)/porosity (%)/shear strength (MPa) of the joined body in the joining material was as follows.

In Example 13, 2.61 μm/26.3%/21.7 MPa (Example 33)
In Comparative Example 10, 2.68 μm/35.7%/8.6 MPa (Comparative Example 20)

<<Condition (b): Comparison Between Joining Materials Having the Same Surface Roughness (1.06 μm)>>

Comparison between joining material of Example 14 and joining material of Comparative Example 1:

The surface roughness (μm)/porosity (%)/shear strength (MPa) of the joined body in the joining material was as follows.

In Example 14, 1.06 μm/11.6%/18.5 MPa (Example 34)
In Comparative Example 1, 1.06 μm/5.3%/12.5 MPa (Comparative Example 11)

From the comparison under the conditions (a) and (b) described above, it was clear that, even if the surface roughness of the joining surface was about the same, there was a significant difference regarding each effect of the surface roughness within a specific range (500 nm or more and 3.3 μm or less) and the porosity of the sintered body in and out of the numerical limitation (8% to 30%), in terms of shear strength of the joined body. In addition, it was also clear that the shear strength of the joined body was significant throughout the numerical range of porosity (8% to 30%).

That is, it was clear that, when "the porosity of the sintered body of 8% to 30%" and "the surface roughness Ra of the joining surface of 500 nm or more and 3.3 μm or less" were combined, the shear strength became particularly remarkable.

<Joining of Silver-Plated Copper Plate and Conductor>

The conductor and the silver-plated copper plate were heat-treated to be joined in the atmosphere using the joining material of Example 1 at a pressure of 0.4 MPa or 1 MPa at temperatures of 200° C., 250° C., and 300° C., to obtain a joined body.

Figure 3A:
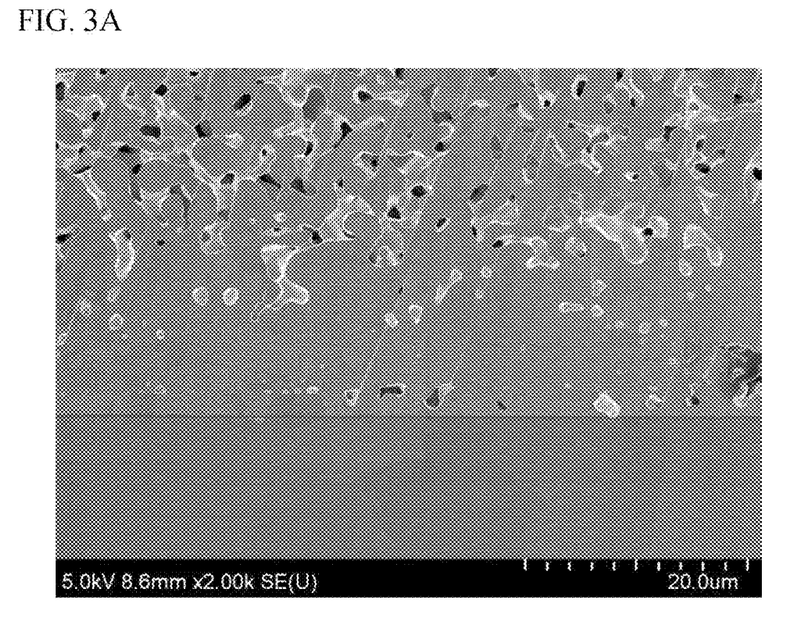
FIG. 3A is a microscopic image of a vicinity of a joined portion between a joining material according to the present invention and a silver-plated copper plate.
Figure 3B:
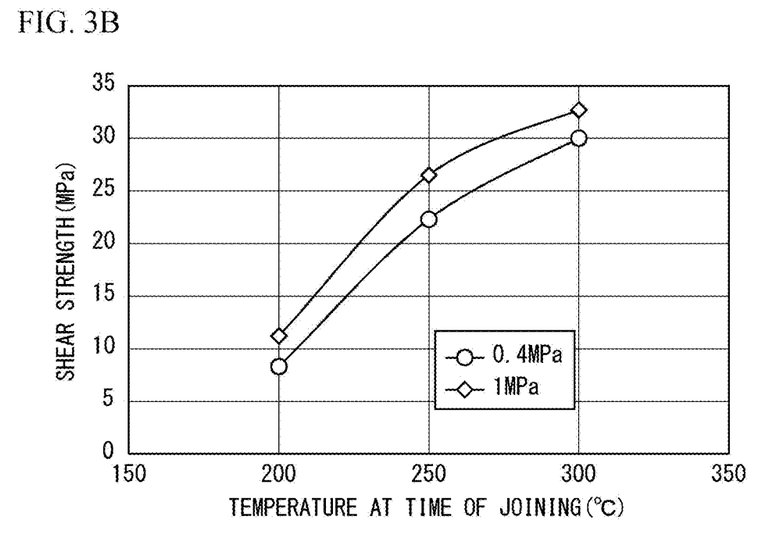
FIG. 3B is a graph showing a relationship between a shear strength of the joined body according to the present invention and a temperature and a pressure at the time of sintering.

FIG. 3A is a microscopic image of a cross section of a joined body obtained by joining by setting a pressure at 0.4 MPa and performing heat treatment at a temperature of 250° C. in the atmosphere by the SEM. FIG. 3B is a graph showing the relationship between the shear strength of the joined body and the temperature and pressure at the time of sintering.

As a result, the joining material of Example 1 was applied in the atmosphere, and the silver-plated copper plate and the conductor could be joined. It was clear that, as the temperature at the time of sintering was high and as the pressure at the time of sintering was high, the shear strength increased.

<Joining of Unplated Copper Plate and Conductor>

The conductor and the unplated copper plate (pure copper plate) were heat-treated to be joined in nitrogen using the joining material of Example 14 at a pressure of 0.4 MPa or 1 MPa at temperatures of 250° C., 300° C., and 350° C. to obtain a joined body.

Figure 4A:
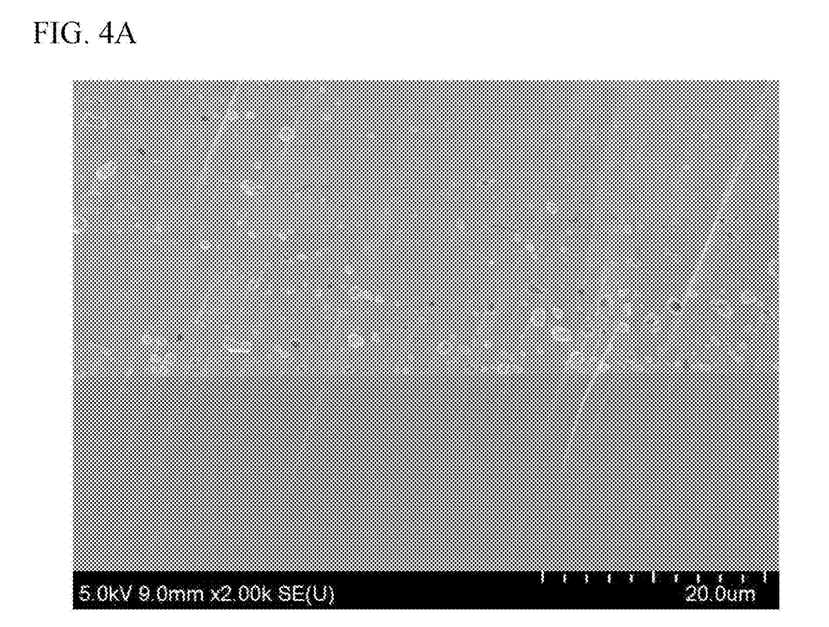
FIG. 4A is a microscopic image of a vicinity of a joined portion between the joining material according to the present invention and an unplated copper plate.
Figure 4B:
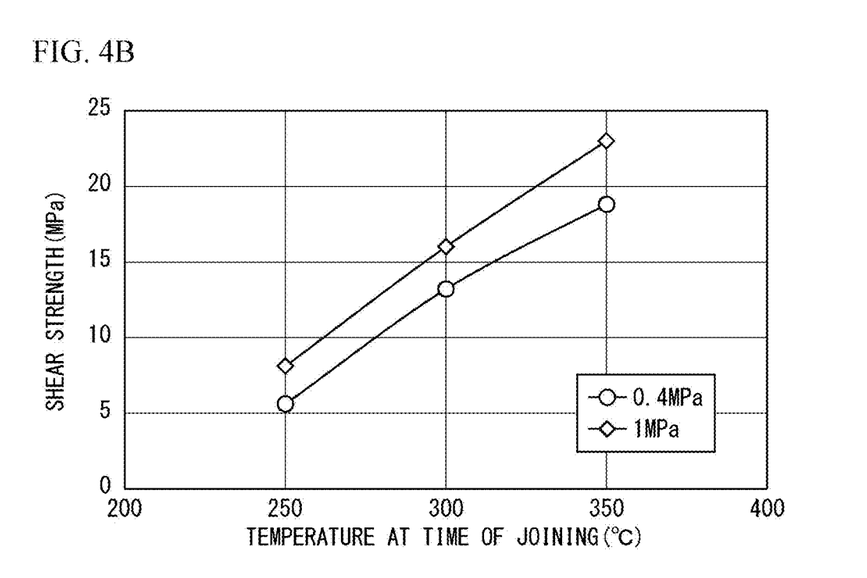
FIG. 4B is a graph showing the relationship between the shear strength of the joined body according to the present invention and the temperature and pressure at the time of sintering.

FIG. 4A is SEM image data of a cross section of a joined body obtained by joining by setting a pressure at 0.4 MPa and performing heat treatment at a temperature of 300° C. in nitrogen. FIG. 4B is a graph showing the relationship between the shear strength of the joined body and the temperature and pressure at the time of sintering.

As a result, the joining material of Example 14 was applied in nitrogen, and the unplated copper plate and the conductor could be directly joined. It was clear that, as the temperature at the time of sintering was high and as the pressure at the time of sintering was high, the shear strength increased.

INDUSTRIAL APPLICABILITY

According to the present invention, it is possible to provide a joining material used for producing a joined body having excellent joining strength compared with that of the related art, a method for producing the joining material, and a joined body using the joining material.

The joining material of the present invention can be used at high temperatures (for example, 300° C. or higher), which was difficult with the joining material of the related art, and is useful as a joining material for electronic components including power semiconductors using silicon carbide (SiC).

REFERENCE SIGNS LIST

10: Joined body
12: Conductor
13: Joining material
14: Substrate

The invention claimed is:

1. A joining material comprising:
a sintered body consisting of a sintered product of silver powder containing a first silver particle group and a second silver particle group having different average particle diameters,
wherein an average particle diameter of the first silver particle group is 50 nm or more and less than 1000 nm, and an average particle diameter of the second silver particle group is 1 μm or more and less than 20 μm,
wherein a porosity of the sintered body is 8% to 30%, the porosity of the sintered body is measured by
first immersing the sintered body in water to measure a volume of the sintered body, and
second measuring a mass of the sintered body;
wherein the volume in a case where the sintered body does not have pores corresponding to the mass thereof is calculated based on a theoretical density; and
wherein the porosity of the sintered body is calculated from the measured volume and the theoretical volume in a case where there are no pores, and
a surface roughness Ra of a joining surface is 1.06 μm or more and 3.3 μm or less.

2. The joining material of claim 1, wherein the porosity of the sintered body is 8% to 27%.

3. The joining material of claim 2, wherein the porosity of the sintered body is 8% to 20%.

4. The joining material of claim 3, wherein the porosity of the sintered body is 9% to 15%.

5. The joining material of claim 1, wherein the porosity of the sintered body is 8% to 27% and the surface roughness Ra is 1.06 μm or more and 2.8 μm or less.

6. The joining material of claim 5, wherein the porosity of the sintered body is 8% to 27%, and the surface roughness Ra is 1.4 μm or more and 2.8 μm or less.

7. The joining material of claim 1, wherein the silver powder further contains a third silver particle group having an average particle diameter of 20 μm or more and less than 60 μm.

8. A method for producing the joining material according to claim 1, the method comprising:
   a step of heating a coating film formed by using a dispersion liquid of a solvent and silver powder to obtain a sintered body, and
   a step of performing plating with one or more selected from the group consisting of silver, copper, tin, gold, and nickel on the surface of the sintered body,
   wherein a content of the solvent in the dispersion liquid is 5% by mass or more and 25% by mass or less.

9. The method for producing a joining material according to claim 8, wherein, in the step of obtaining the sintered body, the coating film is heated while applying a pressure of 5 MPa or less to the coating film.

10. A method for producing the joining material according to claim 1, the method comprising:
    a step of heating a coating film formed by using a dispersion liquid of a solvent and silver powder to obtain a sintered body, and
    a step of performing plating with one or more selected from the group consisting of silver, copper, tin, gold, and nickel on the surface of the sintered body.

11. The method for producing a joining material according to claim 10, wherein the silver powder further contains a third silver particle group having an average particle diameter of 20 μm or more and less than 60 μm.

12. A joined body comprising a conductor and a substrate that are joined by the joining material according to claim 1.

13. A method for producing a joined body comprising:
    joining a conductor and a substrate by using the joining material according to claim 1.

* * * * *